United States Patent [19]

Lucero

[11] Patent Number: 4,581,672

[45] Date of Patent: Apr. 8, 1986

[54] INTERNAL HIGH VOLTAGE (Vpp) REGULATOR FOR INTEGRATED CIRCUITS

[75] Inventor: Elroy M. Lucero, San Jose, Calif.

[73] Assignee: National Semiconductor Corporation, Santa Clara, Calif.

[21] Appl. No.: 528,018

[22] Filed: Aug. 31, 1983

[51] Int. Cl.[4] .............................................. G05F 3/08
[52] U.S. Cl. ..................................... 361/18; 323/224; 361/56; 361/91
[58] Field of Search ...................... 361/56, 91, 88, 111, 361/18; 323/313, 314, 224, 231; 307/297, 580, 568

[56] References Cited

U.S. PATENT DOCUMENTS

| | | | |
|---|---|---|---|
| 4,243,898 | 1/1981 | Seelbach | 323/313 |
| 4,306,185 | 12/1981 | Leuschner | 361/18 X |
| 4,375,074 | 2/1983 | Glogolja | 361/91 |
| 4,423,431 | 12/1983 | Sasaki | 361/56 |
| 4,533,846 | 8/1985 | Simko | 307/550 |

Primary Examiner—Harry E. Moose, Jr.
Attorney, Agent, or Firm—Michael J. Pollock; Paul J. Winters; Gail W. Woodward

[57] ABSTRACT

A circuit for regulating the internal programming voltage (Vpp) supplied to an integrated circuit memory device. The invention limits the internal programming voltage to a maximum value no greater than the field assisted breakdown voltage of on-chip transistors and/or the field transistor threshold voltage. Representatives of the several different types of transistors provided on an integrated circuit substrate are incorporated into the voltage regulating circuit. The regulator transistors are placed in the circuit in such a way that they are designed to break down first in the event of an excessive internal programming voltage (Vpp). In this way, the regulator transistors limit the voltage sent to the operating circuitry of the integrated circuit.

9 Claims, 2 Drawing Figures

INTERNAL HIGH VOLTAGE (Vpp) REGULATOR FOR INTEGRATED CIRCUITS

BACKGROUND OF THE INVENTION

1. Field of the Invention

The present invention relates to integrated circuits. More particularly, the present invention relates to regulating the internal high voltage (Vpp) power supply in an integrated circuit memory device.

2. Description of the Prior Art

The programming voltage generated on-chip in an integrated circuit memory device is a function of the number of voltage multiplier stages used in the internal high voltage generator and of the voltage source (Vcc). Sometimes, the programming voltage can become greater than the breakdown voltages of some of the transistors in the high voltage circuits within the integrated circuit. When this breakdown voltage is exceeded, the memory contents may be disturbed. As a result, the reliability of any system incorporating such an integrated circuit is degraded. In a data processing setting, such lack of reliability may result in the loss of valuable information. Additionally, such excessive voltages may damage the integrated circuit or otherwise damage the equipment in which it is used.

The prior art approach to integrated circuit programming voltage regulation provides off-chip voltage regulation which increases parts, power, and circuit space requirements. Additionally, such off-chip regulation is subject to line interference and circuit transients which can adversely affect the accuracy and effectiveness of the regulator circuit.

SUMMARY OF THE INVENTION

The present invention provides a method and apparatus for regulating the internal voltage (Vpp) generated within an integrated circuit by limiting the maximum voltage value to no greater than the field assisted breakdown voltage of the on-chip transistors and/or the field transistor threshold voltage. The present invention finds particular application within an integrated circuit memory device where it may be advantageously interposed between a high voltage generator circuit and a programming circuit. The invention may also be applied more generally to integrated circuit devices including other types of functional circuits operable from a high voltage source besides programming circuits. Voltage regulation is thereby provided such that voltage supplied by the high voltage generator circuit to the programming circuit or other type of functional circuit is never at a critical threshold level that would disturb the memory device contents or otherwise interfere with the functional circuit.

The present invention incorporates several different types and sizes of regulator transistors and other such solid state devices into a regulating circuit. Each transistor is representative of a different one of the various types and sizes of transistors used on the particular integrated circuit into which the invention is incorporated. For example, if the circuit includes both FET and bipolar types of transistors, then representative FET and bipolar transistors are included in the regulator circuit. Because the transistors are all processed at the same time - being formed on the same integrated circuit substrate - they have the same characteristics as other transistors of the same type located on the chip. The present invention places each of the representative regulator transistors in the regulation circuit in such a way that the transistors break down first in the event of excessive voltage, and thus limit voltages sent to the operating and storage components of the integrated circuit. In this way, precise voltage regulation is maintained and the contents of an associated memory circuit are not disturbed.

In the invention, a first transistor provides a regulated voltage no greater than the transistor's field threshold voltage at a first circuit node. The regulated voltage provided is typically in excess of the lowest circuit device breakdown voltage. The regulated voltage is supplied through series coupled regulator transistors and thereafter to one each of the various transistor types used in the integrated circuit. When one of the representative regulator transistor types breaks down, excess voltage is conducted to a circuit ground. The excess voltage is not, therefore, presented to the internal integrated circuit programming and operating circuitry. The series connected transistors provide a voltage drop sufficient to maintain an adequate supply on internal integrated circuit components to prevent disruption in device operation as a result of regulator transistor breakdown. In this way, disturbance of memory contents is avoided.

DETAILED DESCRIPTION OF A PREFERRED EMBODIMENT

Figure 1:
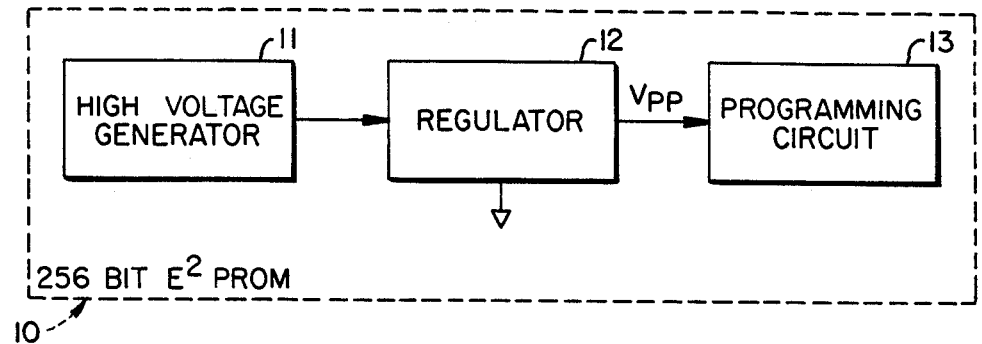
FIG. 1 is a block diagram of a typical integrated circuit incorporating the present invention.

A block diagram of a preferred embodiment of the present invention is shown in FIG. 1. The present invention typically finds application in a 256 bit electrically erasable programmable read only memory ($E^2$-PROM), larger $E^2$PROM's, or other such integrated circuit memory device 10. In the $E^2$PROM circuit, a high voltage generator 11, typically located off the $E^2$PROM chip produces a programming voltage which is coupled to a programming circuit 13 by an embodiment of the present invention, regulator 12. Regulator 12, located on the $E^2$PROM chip, controls internal programming voltage (Vpp) by limiting the maximum value of voltage Vpp to no greater than the field assisted breakdown voltage of $E^2$PROM circuit transistors and/or the field transistor threshold voltage supplied to programming circuit 13.

Figure 2:
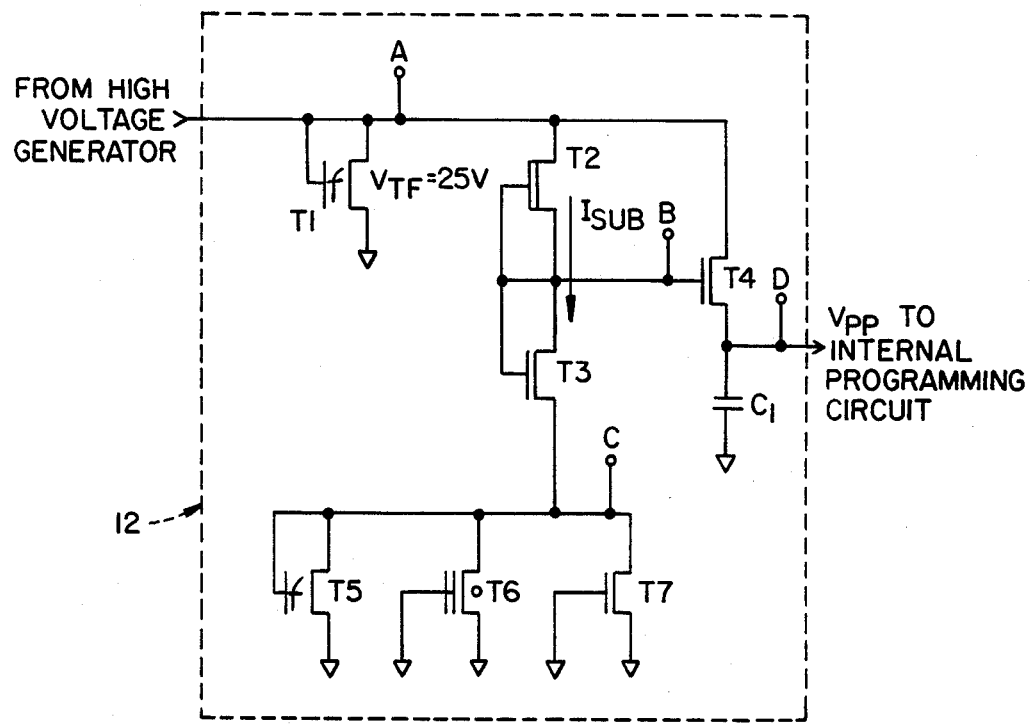
FIG. 2 is a schematic diagram of a voltage regulator for an integrated circuit according to the present invention.

Referring to FIG. 2, circuit 12 is shown including a high voltage generator input of typically 24–30 volts DC and a voltage Vpp output to the internal programming circuit. The voltage at circuit node A is limited to the field threshold ($V_T$) of transistor T1, which is approximately 25 volts DC in the exemplary embodiment of the invention. This voltage is too high for use in the programming circuitry, where the field assisted breakdown voltage is typically 21 volts DC. The voltage at circuit node B is pulled toward the voltage at circuit node A by transistor T2. The voltage at circuit node C follows that at circuit node B through transistor T3.

When the voltage at circuit node C ($V_c$) rises to the breakdown potential of transistors T5–T7 (which are typical or representative of the various transistor types incorporated into the integrated circuit to which regulated power is supplied), the voltage at circuit node C stops increasing and the voltage at circuit node B ($V_b$) is thereby held at $V_b = V_c + V_{T3}$; where $V_{T3}$ is the voltage drop across transistor T3. There is a small amount of current ($I_{sub}$) flowing through transistor T2, but the long channel depletion pullup has only 2-3 volts Vds, and $I_{sub}$ is accordingly less than 0.1 microamps. Voltage Vpp internal at circuit node D ($V_d$) rises to $V_d = V_b - V_{T4} = V_c + V_{T3} - V_{T4}$; where $V_{T4}$ is the voltage drop across transistor T4. Transistors T3 and T4 are identical and are therefore $V_{T3} = V_{T4}$. Therefore, $V_d = V_c =$ breakdown potential of transistors T5, T6, and T7.

Transistors T5-T7 are not connected directly to node A because the breakdown current at that point ($I_{sub}$) is considerably larger and could therefore cause disturbance to data conditions within the associated memory. In the embodiment of the invention shown in FIG. 2, transistor T5 is a field transistor (one having field oxide in place of the normal gate oxide) having a drain-to-source spacing that is a minimum allowable for the process; transistor T6 is a "dummy memory cell" transistor with its floating electrode and gate tied to ground, which represents the worse-case breakdown condition for the entire memory array; and transistor T7 is an enhancement mode transistor with its gate tied to ground, which represents the worse-case breakdown condition for this type of transistor.

Transistors T5-T7 are fabricated to be typical or representative of the various types of transistors incorporated into the integrated circuit to which the present invention supplies regulated power. Transistors T5-T7 are all fabricated in a "worse-case" layout and circuit configuration. Therefore, the breakdown characteristics of these transistors are the same or worse than those of the transistors they protect, i.e. those in the functional circuit. If more than three types, sizes, or other desired characteristics of transistors are included in the circuit then additional representative transistors may be connected to circuit node C as shown for transistors T5-T7.

In operation, when a voltage in excess of a selected maximum level is supplied to the present regulator circuit, the excess voltage is dropped to ground by the breakdown of any of transistors T5-T7. This is done without interfering with the internal programming voltage supplied to programming circuit 13 by the regulator circuit. One particular advantage of the present invention is that the representative transistors T5-T7 are all formed at the same time all other transistors in the integrated circuit are formed. Because all of the transistors are processed at the same time and formed on the same integrated circuit substrate, they have common characteristics with each other and thus may be made to exhibit substantially identical breakdown characteristics. These nearly identical characteristics allow the representative regulator transistors T5-T7 to intercept voltages in excess of a selected maximum and direct the excess to circuit ground while normal internal programming circuit operation is maintained by the regulated voltage Vpp supplied to the internal programming circuit by transistor T4.

The foregoing explanation was given for purposes of illustration and example. It will be appreciated that the present invention is capable of being produced in a number of equivalent embodiments. For example, the present invention may be provided on any other type of integrated circuit requiring a regulated internal voltage. The present invention may also be fabricated in the other integrated circuit technologies, such as bipolar CMOS technologies. Additionally, solid state and other devices having critical breakdown voltages may be incorporated into the regular circuit along with representative regulator transistors. Therefore, the scope of the present invention should be limited only by the breadth of the claims.

I claim:

1. In an integrated circuit connected to an external high voltage source, said integrated circuit comprising a function circuit including a first solid-state device operable from said high voltage characteristic source and having a characteristic breakdown voltage, an internal high voltage regulator coupled between said external high voltage source and said functional circuit, comprising:

a first regulator stage coupled to said high voltage source for limiting internal high voltage supplied to said functional circuit to a first voltage; and a second regulator stage coupled to said first regulator stage and including a second solid-state device substantially identical to said first solid-state device, said second solid-state device providing a path for shunting said internal high voltage away from said functional circuit when said second solid-state device is provided with an internal high voltage in excess of said characteristic breakdown voltage;

whereby said internal high voltage is limited to no greater than the lesser of said characteristic breakdown voltage and said first voltage.

2. The regulator of claim 1, said first regulator stage including a first transistor having a first terminal and a control terminal coupled to said external high voltage source and having a second terminal coupled to a circuit ground, said first regulator stage limiting said internal high voltage to a maximum value no greater than first transistor's field threshold voltage, the control terminal and the first terminal of said transistor being coupled to a first circuit node.

3. The regulator of claim 2, further comprising a second transistor including a first terminal connected to said first circuit node, said second transistor including a control terminal and a second terminal connected to a second circuit node.

4. The regulator of claim 3, further comprising a third transistor including a first terminal and a control terminal connected to said second circuit node, said third transistor including a second terminal connected to a third circuit node.

5. The regulator of claim 4, further comprising a fourth transistor including a first terminal connected to said first circuit node, said fourth transistor including a control terminal connected to said second circuit node, and a second terminal connected to a fourth circuit node to provide said internal high voltage to said functional circuit.

6. The regulator of claim 5 wherein said functional circuit comprises a variety of solid-state devices and said second regulator stage further comprises:

a plurality of regulator transistors representing one each of the various solid-state devices present in said functional circuit, said regulator transistors each including a first terminal coupled to said third circuit node, a second terminal connected to shunt said internal high voltage away from said functional circuit, and said regulator transistors including a control terminal, selectively connected alternatively to said third circuit node and said circuit ground.

7. The regulator of claim 1, wherein said functional circuit comprises a memory programming circuit.

8. In an integrated circuit memory device including a high voltage source and a memory circuit having a variety of transistors operable from said high voltage source, an internal high voltage regulator coupled between said high voltage source and said memory circuit and operable to provide a regulated internal voltage to said memory circuit, comprising:

a first transistor having a gate and a drain terminal coupled at a first circuit node to said voltage source and having a source terminal coupled to a potential source, said first transistor providing a first stage of voltage regulation for limiting said internal voltage to a maximum value no greater than said first transistor's field threshold voltage;

a second transistor including a drain terminal connected to said first circuit node, said transistor including a gate and source terminal connected to a second circuit node;

a third transistor including a gate and drain terminal connected to said second circuit node, said third transistor including a source terminal connected to a third circuit node;

a fourth transistor including a drain terminal connected to said first circuit node, said fourth transistor including a gate terminal connected to said second circuit node, and a source terminal connected to a fourth circuit node to provide an output of said internal voltage to said memory circuit; and a plurality of regulator transistors representing one each of said various memory circuit transistors present in said memory circuit, said regulator transistors each including a drain terminal coupled to said third circuit node, a source terminal connected to the circuit ground, and a gate terminal, selectively connected alternatively to said third circuit node and said circuit ground;

whereby said internal voltage is limited to a maximum value no greater than said first transistor's field threshold voltage and the breakdown voltage of said regulator transistors.

9. The regulator of claim 8, wherein said memory device comprises an E²PROM device.

* * * * *